United States Patent
Honda et al.

(10) Patent No.: US 8,141,514 B2
(45) Date of Patent: Mar. 27, 2012

(54) PLASMA PROCESSING APPARATUS, PLASMA PROCESSING METHOD, AND STORAGE MEDIUM

(75) Inventors: Masanobu Honda, Nirasaki (JP); Naoki Matsumoto, Amagasaki (JP); Satoshi Tanaka, Nirasaki (JP); Yutaka Matsui, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 591 days.

(21) Appl. No.: 11/686,551

(22) Filed: Mar. 15, 2007

(65) Prior Publication Data

US 2007/0224817 A1 Sep. 27, 2007

Related U.S. Application Data (60) Provisional application No. 60/789,146, filed on Apr. 5, 2006.

(30) Foreign Application Priority Data

Mar. 23, 2006 (JP) ................................ 2006-081351

(51) Int. Cl.
- C23C 16/00 (2006.01)
- C23C 16/50 (2006.01)
- C23F 1/00 (2006.01)
- H01L 21/306 (2006.01)

(52) U.S. Cl. ............. 118/723 R; 118/715; 118/723 E; 118/728; 156/345.43; 156/345.44; 156/345.47; 156/345.51

(58) Field of Classification Search ............. 118/715, 118/719, 722, 723 R; 156/345.43, 345.44
See application file for complete search history.

(56) References Cited

U.S. PATENT DOCUMENTS

| 6,074,953 | A | * | 6/2000 | Donohoe et al. ............. 438/710 |
| 6,176,969 | B1 | * | 1/2001 | Park et al. ................. 156/345.29 |
| 6,178,919 | B1 | * | 1/2001 | Li et al. ..................... 118/723 E |
| 6,221,221 | B1 | * | 4/2001 | Al-Shaikh et al. ....... 204/298.02 |
| 6,733,620 | B1 | * | 5/2004 | Sugiyama et al. ........ 156/345.29 |
| 2001/0035132 | A1 | * | 11/2001 | Kent et al. ..................... 118/733 |
| 2001/0050147 | A1 | * | 12/2001 | Nawata et al. ................. 156/345 |
| 2004/0250955 | A1 | * | 12/2004 | Blonigan et al. .......... 156/345.51 |
| 2006/0037701 | A1 | * | 2/2006 | Koshiishi et al. ......... 156/345.44 |
| 2006/0118044 | A1 | * | 6/2006 | Himori et al. ............. 118/723 E |

FOREIGN PATENT DOCUMENTS

| JP | 2001-240973 | 9/2001 |
| JP | 2002-151471 | 5/2002 |
| JP | 2002-533949 | 10/2002 |
| WO | WO 2005/124844 | 12/2005 |

* cited by examiner

*Primary Examiner* — Maureen Gramaglia
*Assistant Examiner* — Tiffany Nuckols
(74) *Attorney, Agent, or Firm* — Oblon, Spivak, McClelland, Maier & Neustadt, L.L.P.

(57) ABSTRACT

A plasma processing apparatus having a substrate processing chamber, which enables leakage of plasma into an exhaust space to be prevented. The substrate processing chamber has therein a processing space in which plasma processing is carried out on a substrate, an exhaust space for exhausting gas out of the processing space, and an exhaust flow path that communicates the exhaust space and the processing space together. The plasma processing apparatus further has a grounding component that is electrically grounded and is disposed in the exhaust flow path. The grounding component has a conducting portion made of a conductive material, and the conducting portion has an exposed area exposed to the exhaust flow path in a range of 100 to 1000 cm$^2$.

1 Claim, 4 Drawing Sheets

PLASMA PROCESSING APPARATUS, PLASMA PROCESSING METHOD, AND STORAGE MEDIUM

BACKGROUND OF THE INVENTION

1. Field of the Invention

The present invention relates to a plasma processing apparatus, a plasma processing method, and a storage medium.

2. Description of the Related Art

Parallel plate type plasma processing apparatuses are known that have a substrate processing chamber that has therein a processing space and into which is transferred a wafer as a substrate, a lower electrode that is disposed in the substrate processing chamber and is connected to a radio frequency power source, and an upper electrode that is disposed such as face the lower electrode. In such a plasma processing apparatus, plasma is produced from a processing gas introduced into the processing space, and the wafer is subjected to plasma processing, for example etching processing, while keeping the plasma in a desired state. Moreover, such a plasma processing apparatus has an exhaust space communicated to the processing space, an exhaust pipe or the like for exhausting out residual gas and so on from the processing space is provided opening out from the exhaust space.

In such a plasma processing apparatus, apparatus components facing the processing space are covered by an insulating film made of alumite, yttria ($Y_2O_3$) or the like, but apparatus components facing the exhaust space are not covered by such an insulating film, or else are only covered by a very thin insulating film. A potential difference thus arises between the processing space and the exhaust space, and hence electrons in the plasma in the processing space are drawn into the exhaust space in accordance with the potential difference. As a result, plasma leaks into the exhaust space.

In particular, in recent years, with an aim of improving the plasma processing performance, plasma processing apparatuses in which the upper electrode is connected to a DC power source and a DC voltage is applied into the processing space have been developed. If such a DC voltage is applied into the processing space, then a large number of electrons are produced in the processing space. The large number of electrons are drawn into the exhaust space in accordance with the potential difference described above, and hence a large amount of plasma leaks into the exhaust space.

If plasma leaks into the exhaust space, then an abnormal electrical discharge may arise in the exhaust pipe, and hence the exhaust pipe may be damaged. Moreover, the plasma density in the processing space is reduced, and hence it may become difficult to carry out desired plasma processing on wafers.

Various methods have thus been developed to prevent leakage of plasma into the exhaust space. For example, it is known that leakage of plasma into the exhaust space is reduced if the anode/cathode ratio for the substrate processing chamber is increased, and hence there are known a method in which the anode/cathode ratio for the substrate processing chamber is increased, specifically a method in which the side face area of a wafer stage disposed in the substrate processing chamber is increased, a method in which an exhaust plate is provided between the processing space and the exhaust space, and a method in which the potential difference described above is eliminated through electrical connection (see, for example, Japanese Laid-open Patent Publication (Kokai) No. 2001-240973).

However, with the method in which the anode/cathode ratio for the substrate processing chamber is increased, there is a problem that the plasma processing apparatus becomes too large in size. Moreover, with the method in which an exhaust plate is provided, there is a problem that the efficiency of exhausting out residual gas and so on from the processing space is reduced. Furthermore, to eliminate the potential difference, apparatus components facing the exhaust space must be covered by an insulating film, and hence there is a problem that the manufacturing cost for the plasma processing apparatus is increased. It is thus difficult to prevent leakage of plasma into the exhaust space.

SUMMARY OF THE INVENTION

It is an object of the present invention to provide a plasma processing apparatus, a plasma processing method, and a storage medium, that enable leakage of plasma into an exhaust space to be prevented.

To attain the above object, the present invention provides a plasma processing apparatus a plasma processing apparatus having a substrate processing chamber having therein a processing space in which plasma processing is carried out on a substrate, an exhaust space for exhausting gas out of the processing space, and an exhaust flow path that communicates the exhaust space and the processing space together; wherein the plasma processing apparatus further has a grounding component that is electrically grounded and is disposed in the exhaust flow path, the grounding component having a conducting portion made of a conductive material, and the conducting portion having an exposed area exposed to the exhaust flow path in a range of 100 to 1000 $cm^2$.

According to the above construction, an electrically grounded grounding component is disposed in the exhaust flow path that communicates the exhaust space and the processing space together, the exposed area of a conducting portion of the grounding component exposed to the exhaust flow path being in a range of 100 to 1000 $cm^2$. Electrons in plasma flowing into the exhaust flow path from the processing space are introduced into the grounding component. Moreover, because the exposed area of the conducting portion of the grounding component exposed to the exhaust flow path is not less than 100 $cm^2$, sufficient contact area can be secured between the conducting portion and electrons. As a result, electrons are not drawn into the exhaust space, and hence leakage of plasma into the exhaust space can be prevented. Furthermore, because the exposed area of the conducting portion of the grounding component exposed to the exhaust flow path is not more than 1000 $cm^2$, the voltage in the processing space can be prevented from decreasing excessively due to the grounding component, and hence the plasma ignition performance can be prevented from decreasing.

Preferably, the plasma processing apparatus further has a DC electrode that applies a DC voltage into the processing space.

According to the above construction, there is provided a DC electrode that applies a DC voltage into the processing space. Upon the DC voltage being applied into the processing space, a large number of electrons are produced in the processing space. However, even if the large number of electrons flow into the exhaust flow path, the electrons are introduced into the grounding component. As a result, the large number of electrons are not drawn into the exhaust space, and hence leakage of plasma into the exhaust space can be prevented.

Preferably, the conductive material comprises at least one selected from the group consisting of silicon, silicon carbide, and amorphous carbon.

According to the above construction, the conductive material constituting the conducting portion of the grounding component comprises at least one selected from the group consisting of silicon, silicon carbide, and amorphous carbon. As a result, the grounding component is not a source of metal contamination, and hence the substrate can be prevented from being subjected to metal contamination.

Moreover, to attain the above object, the present invention provides a plasma processing method for a plasma processing apparatus having a substrate processing chamber having therein a processing space in which plasma processing is carried out on a substrate, an exhaust space for exhausting gas out of the processing space, and an exhaust flow path that communicates the exhaust space and the processing space together, and having a grounding component that is electrically grounded and is disposed in the exhaust flow path, the grounding component having a conducting portion made of a conductive material, and the conducting portion having an exposed area exposed to the exhaust flow path in a range of 100 to 1000 cm$^2$, the plasma processing method having: a plasma production step of producing plasma in the processing space; and an electron introducing step of introducing electrons in the plasma into the grounding component.

According to the above construction, plasma is produced in the processing space that is communicated to the exhaust space by the exhaust flow path, and electrons in the plasma are introduced into a grounding component that is electrically grounded and has a conducting portion having an exposed area exposed to the exhaust flow path in a range of 100 to 1000 cm$^2$. Because the exposed area of the conducting portion of the grounding component exposed to the exhaust flow path is not less than 100 cm$^2$, sufficient contact area can be secured between the conducting portion and electrons. As a result, electrons are not drawn into the exhaust space, and hence leakage of plasma into the exhaust space can be prevented. Furthermore, because the exposed area of the conducting portion of the grounding component exposed to the exhaust flow path is not more than 1000 cm$^2$, the voltage in the processing space can be prevented from decreasing excessively due to the grounding component, and hence the plasma ignition performance can be prevented from decreasing.

Preferably, the plasma processing method further has a DC voltage application step of applying a DC voltage into the processing space.

According to the above construction, a DC voltage is applied into the processing space. Upon the DC voltage being applied into the processing space, a large number of electrons are produced in the processing space. However, even if the large number of electrons flow into the exhaust flow path, the electrons are introduced into the grounding component. As a result, the large number of electrons are not drawn into the exhaust space, and hence leakage of plasma into the exhaust space can be prevented.

Moreover, to attain the above object, the present invention provides a storage medium storing a program for causing a computer to implement a plasma processing method for a plasma processing apparatus having a substrate processing chamber having therein a processing space in which plasma processing is carried out on a substrate, an exhaust space for exhausting gas out of the processing space, and an exhaust flow path that communicates the exhaust space and the processing space together, and having a grounding component that is electrically grounded and is disposed in the exhaust flow path, the grounding component having a conducting portion made of a conductive material, and the conducting portion having an exposed area exposed to the exhaust flow path in a range of 100 to 1000 cm$^2$, the program having: a plasma production module for producing plasma in the processing space; and an electron introducing module for introducing electrons in the plasma into the grounding component.

The above and other objects, features and advantages of the invention will become apparent from the following detailed description taken in conjunction with the accompanying drawings.

DESCRIPTION OF THE PREFERRED EMBODIMENT

The present invention will now be described in detail below with reference to the accompanying drawings showing an embodiment thereof.

Figure 1:
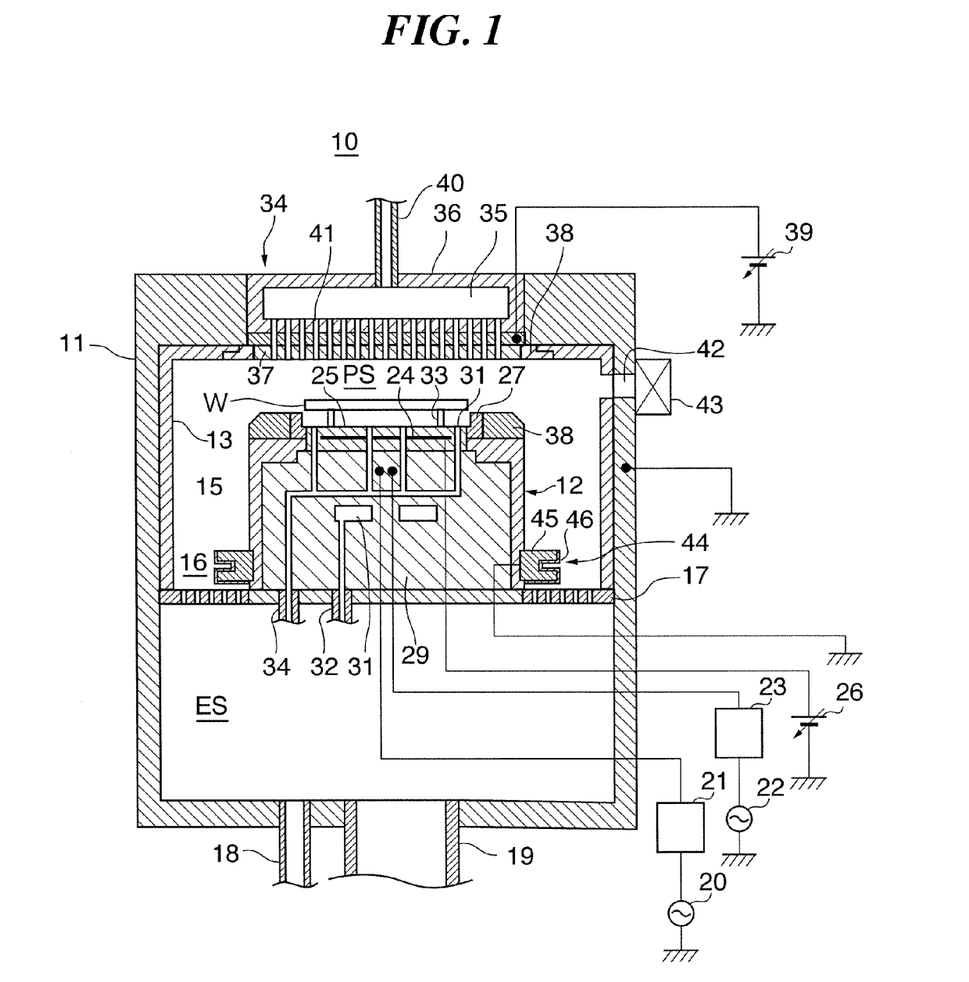
FIG. 1 is a sectional view schematically showing the construction of a plasma processing apparatus according to an embodiment.

FIG. 1 is a sectional view schematically showing the construction of a plasma processing apparatus according to the embodiment. The plasma processing apparatus is constructed such as to carry out RIE (reactive ion etching) processing on a semiconductor wafer W as a substrate.

As shown in FIG. 1, the plasma processing apparatus 10 has a cylindrical substrate processing chamber 11, there being a processing space PS in an upper portion of the substrate processing chamber 11. Plasma, described below, is produced in the processing space PS.

Moreover, the substrate processing chamber 11 has disposed therein a cylindrical susceptor 12 as a stage on which is mounted a semiconductor wafer W (hereinafter referred to merely as a "wafer W") having a diameter of, for example, 300 mm. An inner wall surface of the substrate processing chamber 11 is covered by a side wall member 13. The side wall member 13 is made of aluminum, a surface thereof that faces the processing space PS being coated with yttria or alumite having a predetermined thickness. The substrate processing chamber 11 is electrically grounded, and hence the side wall member 13 is at ground potential. Moreover, the susceptor 12 has a conductor portion 14 made of a conductive material, for example aluminum, and a susceptor side face covering member 15 made of an insulating material covering a side face of the conductor portion 14.

In the plasma processing apparatus 10, an exhaust flow path 16 that acts as a flow path through which gas above the susceptor 12 is exhausted out of the substrate processing chamber 11 is formed between an inner wall of the substrate processing chamber 11 and the side face of the susceptor 12. An exhaust plate 17 which is a plate-shaped member having a large number of vent holes 47 therein is disposed in the exhaust flow path 16. The exhaust plate 17 partitions the exhaust flow path 16 from an exhaust space ES which is a space in a lower portion of the substrate processing chamber 11. Here, the exhaust flow path 16 communicates the exhaust space ES and the processing space PS together. Moreover, a roughing exhaust pipe 18 and a main exhaust pipe 19 are provided opening out from the exhaust space ES. The roughing exhaust pipe 18 has a DP (dry pump) (not shown) connected thereto, and the main exhaust pipe 19 has a TMP (turbo-molecular pump) (not shown) connected thereto. Moreover, for components that face the exhaust space ES and for the surface of the inner wall, a conductive material is bared to the exhaust space ES, being covered only with a very thin insulating film. A potential difference thus arises between the processing space PS and the exhaust space ES.

The roughing exhaust pipe 18, the main exhaust pipe 19, the DP, and the TMP together constitute an exhausting apparatus. The roughing exhaust pipe 18 and the main exhaust pipe 19 exhaust gas in the processing space PS out of the substrate processing chamber 11 via the exhaust flow path 16 and the exhaust space ES. Specifically, the roughing exhaust pipe 18 reduces the pressure in the substrate processing chamber 11 from atmospheric pressure down to a low vacuum state, and the main exhaust pipe 19 is operated in collaboration with the roughing exhaust pipe 18 to reduce the pressure in the substrate processing chamber 11 from atmospheric pressure down to a high vacuum state (e.g. a pressure of not more than 133 Pa (1 Torr)), which is at a lower pressure than the low vacuum state.

A radio frequency power source 20 is connected to the conductor portion 14 of the susceptor 12 via a matcher 21. The radio frequency power source 20 supplies radio frequency electrical power of a relatively high frequency, for example 40 MHz, to the conductor portion 14. The conductor portion 14 of the susceptor 12 thus acts as an RF electrode. The matcher 21 reduces reflection of the radio frequency electrical power from the conductor portion 14 so as to maximize the efficiency of the supply of the radio frequency electrical power into the conductor portion 14. Moreover, another radio frequency power source 22 is connected to the conductor portion 14 via a matcher 23. The other radio frequency power source 22 supplies radio frequency electrical power of a lower frequency than the radio frequency electrical power supplied by the radio frequency power source 20, for example 2 MHz, to the conductor portion 14. The matcher 23 has a similar function to the matcher 21. Through the above, the susceptor 12 applies 40 MHz radio frequency electrical power and 2 MHz radio frequency electrical power into the processing space PS.

A disk-shaped electrostatic chuck 25 having an electrode plate 24 therein is provided in an upper portion of the susceptor 12. When a wafer W is mounted on the susceptor 12, the wafer W is disposed on the electrostatic chuck 25. A DC power source 26 is electrically connected to the electrode plate 24. Upon a negative DC voltage being applied to the electrode plate 24, a positive potential is produced on a rear surface of the wafer W. A potential difference thus arises between the electrode plate 24 and the rear surface of the wafer W, and hence the wafer W is attracted to and held on an upper surface of the electrostatic chuck 25 through a Coulomb force or a Johnsen-Rahbek force due to the potential difference.

An annular focus ring 27 is provided on an upper portion of the susceptor 12 so as to surround the wafer W attracted to and held on the upper surface of the susceptor 12. The focus ring 27 is made of silicon (Si) or silica ($SiO_2$). The focus ring 27 is exposed to the processing space PS, and focuses plasma in the processing space PS toward a front surface of the wafer W, thus improving the efficiency of the RIE processing. Moreover, an annular cover ring 28 made of quartz that protects a side face of the focus ring 27 is disposed surrounding the focus ring 27.

An annular coolant chamber 29 that extends, for example, in a circumferential direction of the susceptor 12 is provided inside the susceptor 12. A coolant, for example cooling water or a Galden (registered trademark) fluid, at a predetermined temperature is circulated through the coolant chamber 29 via coolant piping 30 from a chiller unit (not shown). A processing temperature of the wafer W attracted to and held on the upper surface of the susceptor 12 is controlled through the temperature of the coolant.

A plurality of heat transfer gas supply holes 31 are provided in a portion of the upper surface of the susceptor 12 on which the wafer W is attracted and held (hereinafter referred to as the "attracting surface"). The heat transfer gas supply holes 31 are connected to a heat transfer gas supply unit (not shown) by a heat transfer gas supply line 32 which is disposed inside the susceptor 12. The heat transfer gas supply unit supplies helium (He) gas as a heat transfer gas via the heat transfer gas supply holes 31 into a gap between the attracting surface of the susceptor 12 and the rear surface of the wafer W.

A plurality of pusher pins 33 are provided in the attracting surface of the susceptor 12 as lifting pins that can be made to project out from the upper surface of the susceptor 12. The pusher pins 33 are connected to a motor (not shown) by a ball screw (not shown), and can be made to project out from the attracting surface of the susceptor 12 through rotational motion of the motor, which is converted into linear motion by the ball screw. The pusher pins 33 are housed inside the susceptor 12 when a wafer W is being attracted to and held on the attracting surface of the susceptor 12 so that the wafer W can be subjected to the RIE processing, and are made to project out from the upper surface of the susceptor 12 so as to lift the wafer W up away from the susceptor 12 when the wafer W is to be transferred out from the substrate processing chamber 11 after having been subjected to the RIE processing.

A gas introducing shower head 34 is disposed in a ceiling portion of the substrate processing chamber 11 such as to face the susceptor 12. The gas introducing shower head 34 has an electrode plate support 36 made of an insulating material having a buffer chamber 35 formed therein, and an upper electrode plate 37 supported from the electrode plate support 36. A lower surface of the upper electrode plate 37 is exposed to the processing space PS. The upper electrode plate 37 is a disk-shaped member made of a conductive material, for example silicon. A peripheral portion of the upper electrode plate 37 is covered by an annular shield ring 38 made of an insulating material. The upper electrode plate 37 is thus electrically insulated by the electrode plate support 36 and the shield ring 38 from the wall of the substrate processing chamber 11, which is at the ground potential.

A DC power source 39 is electrically connected to the upper electrode plate 37, and applies a negative DC voltage to the upper electrode plate 37. The upper electrode plate 37 thus applies a DC voltage into the processing space PS. Because a DC voltage is applied to the upper electrode plate 37, there is no need to provide a matcher between the upper electrode plate 37 and the DC power source 39, and hence compared with the case that a radio frequency power source is connected to the upper electrode plate via a matcher as in a conventional plasma processing apparatus, the structure of the plasma processing apparatus 10 can be simplified.

A processing gas introducing pipe 40 leading from a processing gas supply unit (not shown) is connected to the buffer chamber 35 in the electrode plate support 36. Moreover, the gas introducing shower head 34 has therein a plurality of gas holes 41 that communicate the buffer chamber 35 to the processing space PS. A processing gas supplied from the processing gas introducing pipe 40 into the buffer chamber 35 is supplied by the gas introducing shower head 34 into the processing space PS via the gas holes 41.

A transfer port 42 for the wafers W is provided in a side wall of the substrate processing chamber 11 in a position at the height of a wafer W that has been lifted up from the susceptor 12 by the pusher pins 33. A gate valve 43 for opening and closing the transfer port 42 is provided in the transfer port 42.

In the substrate processing chamber 11 of the plasma processing apparatus 10, the conductor portion 14 of the susceptor 12 applies radio frequency electrical power into the processing space PS, i.e. the space between the susceptor 12 and the upper electrode plate 37, as described above, whereby the processing gas supplied into the processing space PS from the gas introducing shower head 34 is turned into high-density plasma, so that positive ions and radicals are produced. Furthermore, the plasma is kept in a desired state by the upper electrode plate 37 applying a DC voltage into the processing space PS. The wafer W is subjected to the RIE processing by the positive ions and radicals.

Moreover, in the plasma processing apparatus 10, a grounding ring 44 (grounding component) is disposed in the vicinity of the exhaust plate 17 in the exhaust flow path 16. The grounding ring 44 is comprised of a conducting portion 45 made of a conductive material such as silicon that is electrically grounded, and an insulating film 46 made of an insulating material that covers a surface of the conducting portion 45. The insulating film 46 partially covers the surface of the conducting portion 45, and hence part of the surface of the conducting portion 45 is exposed to the exhaust flow path 16. An exposed area of the conducting portion 45 exposed to the exhaust flow path 16 is set in a range of 100 to 1000 $cm^2$. Moreover, the grounding ring 44 is disposed such as to surround the side face of the susceptor 12.

In the plasma processing apparatus 10, upon plasma being produced in the processing space PS, electrons in the plasma flow into the exhaust flow path 16 in accordance with the potential difference between the processing space PS and the exhaust space ES. In particular, for the plasma processing apparatus 10, because a DC voltage is applied into the processing space PS, a large number of electrons are produced in the processing space PS. Here, electrons are generally introduced into an anode present in the vicinity of the electrons, and hence electrons flowing into the exhaust flow path 16 are introduced into the grounding ring 44, specifically onto the surface of the conducting portion 45 exposed to the exhaust flow path 16. As a result, the electrons flowing into the exhaust flow path 16 are prevented from being drawn into the exhaust space ES.

Next, a plasma processing method implemented by the plasma processing apparatus according to the present embodiment will be described.

In the plasma processing, first, a wafer W is transferred into the substrate processing chamber 11, and disposed on the electrostatic chuck 25 of the susceptor 12, whereupon the electrostatic chuck 25 attracts and holds the wafer W.

Next, the exhausting apparatus reduces the pressure in the substrate processing chamber 11, in particular the processing space PS, down to a predetermined pressure, and the gas introducing shower head 34 supplies the processing gas into the processing space PS. After that, the susceptor 12 applies radio frequency electrical power into the processing space PS, thus producing high-density plasma from the supplied processing gas, so that positive ions and radicals are produced. Moreover, the upper electrode plate 37 applies a DC voltage into the processing space PS, thus keeping the plasma in a desired state. The wafer W is subjected to the RIE processing by the positive ions and radicals kept in the desired state.

During the RIE processing, electrons in the plasma in the processing space PS flow into the exhaust flow path 16 in accordance with the potential difference between the processing space PS and the exhaust space ES. The grounding ring 44 disposed in the exhaust flow path 16 introduces the electrons onto the surface of the conducting portion 45 exposed to the exhaust flow path 16.

Once the RIE processing on the wafer W is completed, the exhausting apparatus exhausts residual gas and so on in the processing space PS out of the substrate processing chamber 11, and then the plasma processing apparatus 10 transfers the wafer W out from the substrate processing chamber 11, whereupon the present processing comes to an end.

According to the plasma processing apparatus 10, the electrically grounded grounding ring 44 is disposed in the exhaust flow path 16 that communicates the exhaust space ES and the processing space PS together. As a result, electrons in the plasma in processing space PS are not drawn into the exhaust space ES. Moreover, because the plasma processing apparatus 10 has therein the upper electrode plate 37 which applies a DC voltage into the processing space PS, a large number of electrons are produced in the processing space PS upon the DC voltage being applied into the processing space PS; however, even if the large number of electrons flow into the exhaust flow path 16, the electrons are introduced into the grounding ring 44, and hence the large number of electrons are not drawn into the exhaust space ES. As a result of the above, leakage of plasma into the exhaust space ES can be prevented.

Moreover, even if the anode/cathode ratio for the substrate processing chamber 11 in the plasma processing apparatus 10 is low (i.e. the side face area of the susceptor 12 is low), the above effects can be achieved through the grounding ring 44 being disposed in the exhaust flow path 16. As a result, even in the case, for example, that the anode/cathode ratio is low, leakage of plasma into the exhaust space ES can be prevented.

In the plasma processing apparatus 10 described above, the grounding ring 44 is disposed in the vicinity of the exhaust plate 17 in the exhaust flow path 16. However, it is known that the density of electrons in the exhaust flow path 16 is substantially uniform, and hence the grounding ring 44 may alternatively be disposed in the vicinity of the cover ring 28 in the exhaust flow path 16. Note, however, that if the grounding ring 44 were disposed in the processing space PS, then the grounding ring 44 would actively introduce into itself electrons in the processing space PS, and hence it would become impossible to keep the plasma in the processing space PS in the desired state. It is thus undesirable to dispose the grounding ring 44 in the processing space PS.

Figure 2:
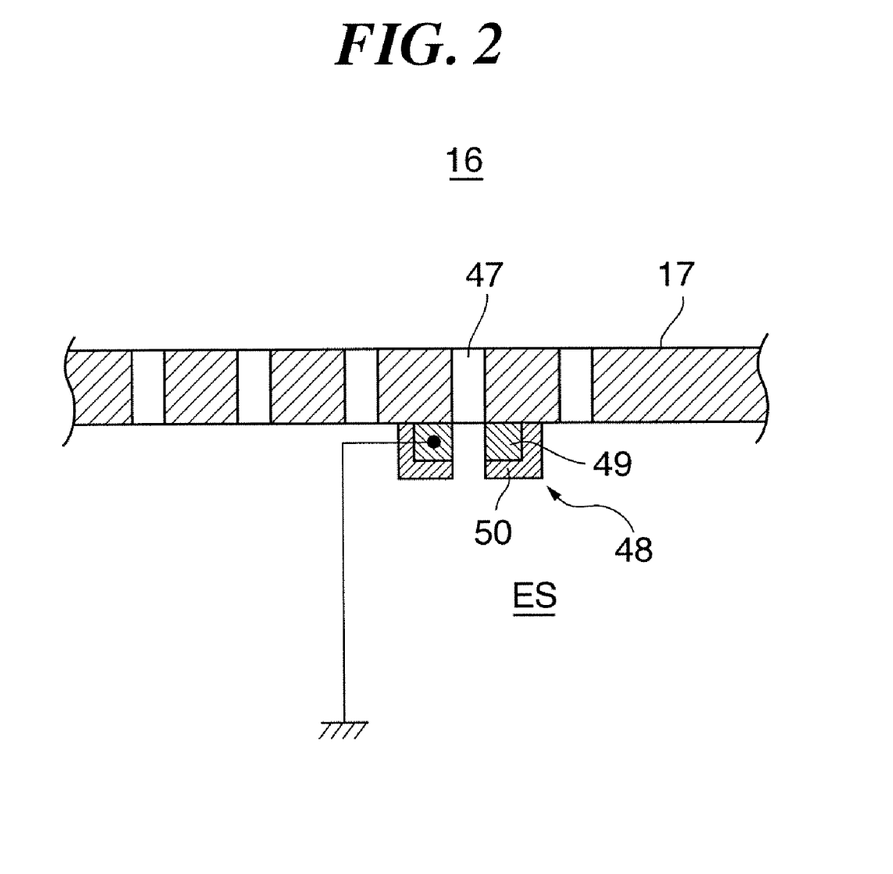
FIG. 2 is a sectional view showing a variation of a grounding ring.
Figure 3A:
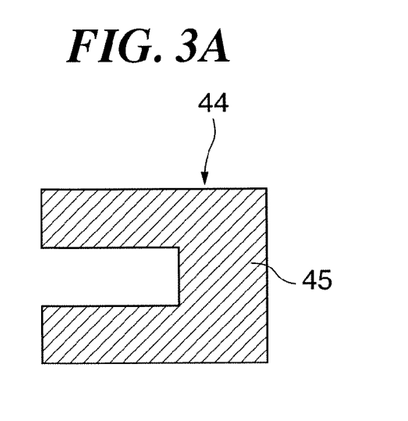
FIGS. 3A to 3F are sectional views showing grounding rings having different exposed areas.
Figure 3B:
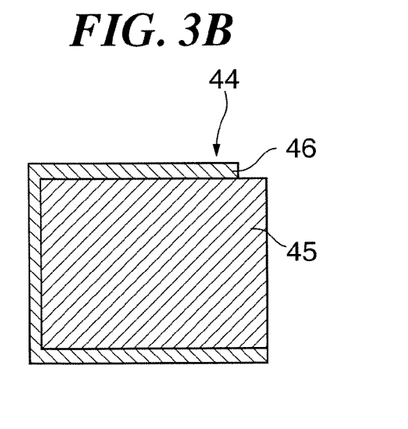
Figure 3C:
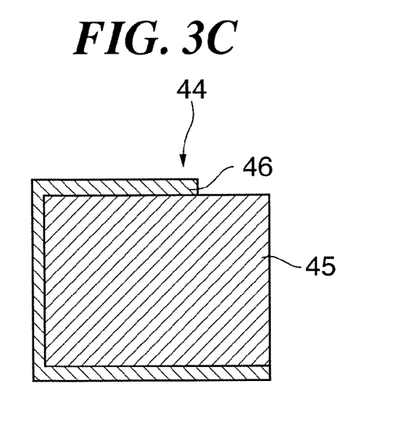
Figure 3D:
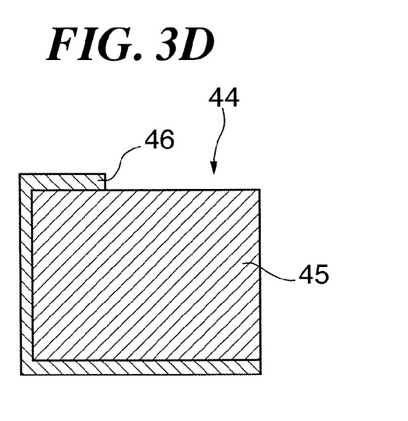
Figure 3E:
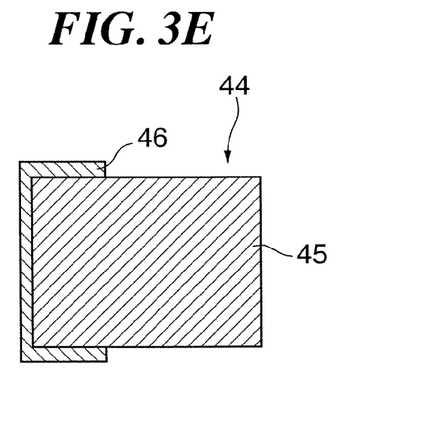
Figure 3F:
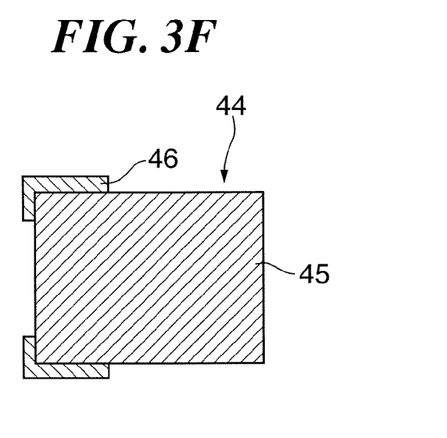

Moreover, from the viewpoint of preventing an abnormal electrical discharge from arising in the roughing exhaust pipe 18 or the main exhaust pipe 19 that are provided opening out from the exhaust space ES, it is preferable for it be possible to prevent the plasma from diffusing into the exhaust space ES from the exhaust plate 17 if the plasma manages to go past the exhaust plate 17. To attain this object, it is preferable for a grounding ring 48 to be disposed on the exhaust space ES side of the exhaust plate 17 such as to surround an opening of a vent hole 47 in the exhaust plate 17 (see FIG. 2). The grounding ring 48 is comprised of a conducting portion 49 made of silicon that is electrically grounded, and an insulating film 50 that partially covers a surface of the conducting portion 49. For the grounding ring 48, part of the surface of the conducting portion 49 is exposed to electrons passing through the vent holes 47 together with the gas. Electrons passing through the vent holes 47 are thus introduced onto this part of the surface of the conducting portion 49. As a result, electrons that have managed to go past the exhaust plate 17 can be prevented from diffusing into the exhaust space ES.

In the plasma processing apparatus 10, the conducting portion 45 of the grounding ring 44 is made of silicon. As a result, the grounding ring 44 is not a source of metal contamination, and hence the wafers W can be prevented from being subjected to metal contamination. The conductive material constituting the conducting portion 45 of the grounding ring 44 is not limited to being silicon, but rather may alternatively be, for example, silicon carbide (SiC), amorphous carbon, or a metal that does not give rise to metal contamination. Moreover, from the viewpoint of introducing electrons thereto, the conductive material is preferably one having a low volume resistivity.

Moreover, in the grounding ring 44, the surface of the conducting portion 45 is covered by an insulating film 46 made of an insulating material. However, the conducting portion 45 may alternatively not be covered by the insulating film 46, the whole surface of the conducting portion 45 being exposed to the exhaust flow path 16. Note, however, that even in this case, the exposed area of the conducting portion 45 exposed to the exhaust flow path 16 is set in a range of 100 to 1000 cm$^2$.

Moreover, the plasma processing apparatus to which the present invention is applied may be any apparatus in which plasma is produced in a processing space. Specifically, the plasma processing apparatus may be not only one in which radio frequency electrical power of two different frequencies is supplied to the susceptor 12 as a radio frequency electrode as in the plasma processing apparatus 10 described above, but also one in which radio frequency electrical power is supplied to both the upper electrode plate and the susceptor, or one in which only one type of radio frequency electrical power is supplied to the susceptor. Moreover, even in the case that a DC voltage is not applied to the upper electrode plate, if plasma is produced in the processing space, then electrons will still be produced in the processing space; the present invention may thus also be applied even in the case of a plasma processing apparatus in which a DC voltage is not applied to the upper electrode plate.

Furthermore, the substrates subjected to the RIE processing in the plasma processing apparatus 10 described above are not limited to being semiconductor wafers for semiconductor devices, but rather may instead be any of various substrates used in LCDs (liquid crystal displays), FPDs (flat panel displays) or the like, photomasks, CD substrates, printed substrates, or the like.

Moreover, it is to be understood that the object of the present invention may also be accomplished by supplying a system or apparatus with a storage medium in which is stored a program code of software that realizes the functions of the embodiment described above, and then causing a computer (or CPU, MPU, etc.) of the system or apparatus to read out and execute the program code stored in the storage medium.

In this case, the program code itself read out from the storage medium realizes the functions of the embodiment described above, and hence the program code and the storage medium storing the program code constitute the present invention.

The storage medium for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, or a ROM. Alternatively, the program code may be downloaded via a network.

Moreover, it is to be understood that the functions of the embodiment described above can be realized not only by executing a program code read out by a computer, but also by causing an OS (operating system) or the like which operates on the computer to perform a part or all of the actual operations based on instructions of the program code.

Furthermore, it is to be understood that the functions of the embodiment described above may also be accomplished by writing a program code read out from a storage medium into a memory provided on an expansion board inserted into a computer or in an expansion unit connected to the computer and then causing a CPU or the like provided on the expansion board or in the expansion unit to perform a part or all of the actual operations based on instructions of the program code.

WORKING EXAMPLES

Next, working examples of the present invention will be described in detail.

Working Example 1

First, in the plasma processing apparatus 10 described above, while applying a DC voltage of −600V to the upper electrode plate 37 from the DC power source 39, 40 MHz radio frequency electrical power was supplied from the radio frequency power source 20 to the conductor portion 14 of the susceptor 12 and 2 MHz radio frequency electrical power was supplied from the other radio frequency power source 22 to the conductor portion 14 of the susceptor 12, so as to produce plasma in the processing space PS. The emission intensity of plasma that leaked into the exhaust space ES was then observed, with the value of the 40 MHz radio frequency electrical power and the value of the 2 MHz radio frequency electrical power being changed.

The value of the 40 MHz radio frequency electrical power and the value of the 2 MHz radio frequency electrical power were each set to three levels, being respectively 500 W, 1000 W, or 2000 W, and 0 W, 1000 W, or 2000 W. The observed emission intensities (arb. units) are shown in Table 1 below.

TABLE 1

|  | 500 (W) | 1000 (W) | 2000 (W) |
| --- | --- | --- | --- |
| 0 (W) | 124 | 141 | 200 |
| 1000 (W) | 75 | 99 | 147 |
| 2000 (W) | 78 | 104 | 132 |

Comparative Example 1

First, in the plasma processing apparatus 10 described above, the grounding ring 44 was removed from the susceptor 12. Then, while applying a DC voltage of −600V to the upper electrode plate 37 from the DC power source 39, 40 MHz radio frequency electrical power was supplied from the radio frequency power source 20 to the conductor portion 14 of the susceptor 12 and 2 MHz radio frequency electrical power was supplied from the other radio frequency power source 22 to the conductor portion 14 of the susceptor 12, so as to produce plasma in the processing space PS. The emission intensity of plasma that leaked into the exhaust space ES was then observed, with the value of the 40 MHz radio frequency electrical power and the value of the 2 MHz radio frequency electrical power being changed.

As in working example 1, the value of the 40 MHz radio frequency electrical power and the value of the 2 MHz radio frequency electrical power were each set to three levels, being respectively 500 W, 1000 W, or 2000 W, and 0 W, 1000 W, or 2000 W. The observed emission intensities (arb. units) are shown in Table 2 below.

TABLE 2

|  | 500 (W) | 1000 (W) | 2000 (W) |
|---|---|---|---|
| 0 (W) | 4676 | 13981 | 17070 |
| 1000 (W) | 21742 | 9963 | 17581 |
| 2000 (W) | 15962 | 44199 | 21045 |

Comparing Table 1 and Table 2, it can be seen that in comparative example 1 in which the grounding ring 44 was not provided in the exhaust flow path 16, regardless of the value of the 40 MHz radio frequency electrical power and the value of the 2 MHz radio frequency electrical power, the emission intensity of plasma that leaked into the exhaust space ES was much greater than 300 arb. units, which is the emission intensity corresponding to a tolerable amount of leakage of plasma in the exhaust space ES (hereinafter referred to as the "tolerable emission intensity"), whereas in working example 1 in which the grounding ring 44 was provided in the exhaust flow path 16, regardless of the value of the 40 MHz radio frequency electrical power and the value of the 2 MHz radio frequency electrical power, the emission intensity of plasma that leaked into the exhaust space ES was always below the tolerable emission intensity. It can thus be seen that leakage into the exhaust space ES can be prevented by providing the grounding ring 44 in the exhaust flow path 16.

Next, the case that a DC voltage was not applied to the upper electrode plate 37 was studied.

Working Example 2

First, in the plasma processing apparatus 10 described above, without applying a DC voltage to the upper electrode plate 37 from the DC power source 39, 40 MHz radio frequency electrical power was supplied from the radio frequency power source 20 to the conductor portion 14 of the susceptor 12 and 2 MHz radio frequency electrical power was supplied from the other radio frequency power source 22 to the conductor portion 14 of the susceptor 12, so as to produce plasma in the processing space PS. The state of the plasma in the processing space PS, that is whether or not the plasma was stable, was then observed, with the value of the 40 MHz radio frequency electrical power and the value of the 2 MHz radio frequency electrical power being changed.

Here, the value of the 40 MHz radio frequency electrical power and the value of the 2 MHz radio frequency electrical power were again each set to three levels, being respectively 500 W, 1000 W, or 2000 W, and 0 W, 1000 W, or 2000 W. The observed plasma states are shown in Table 3 below.

TABLE 3

|  | 500 (W) | 1000 (W) | 2000 (W) |
|---|---|---|---|
| 0 (W) | STABLE | STABLE | STABLE |
| 1000 (W) | STABLE | STABLE | STABLE |
| 2000 (W) | STABLE | STABLE | STABLE |

Comparative Example

First, in the plasma processing apparatus 10 described above, the grounding ring 44 was removed from the susceptor 12. Then, without applying a DC voltage to the upper electrode plate 37 from the DC power source 39, 40 MHz radio frequency electrical power was supplied from the radio frequency power source 20 to the conductor portion 14 of the susceptor 12 and 2 MHz radio frequency electrical power was supplied from the other radio frequency power source 22 to the conductor portion 14 of the susceptor 12, so as to produce plasma in the processing space PS. The state of the plasma in the processing space PS, that is whether or not the plasma was stable, was then observed, with the value of the 40 MHz radio frequency electrical power and the value of the 2 MHz radio frequency electrical power being changed.

Here, the value of the 40 MHz radio frequency electrical power and the value of the 2 MHz radio frequency electrical power were again each set to three levels, being respectively 500 W, 1000 W, or 2000 W, and 0 W, 1000 W, or 2000 W. The observed plasma states are shown in Table 4 below.

TABLE 4

|  | 500 (W) | 1000 (W) | 2000 (W) |
|---|---|---|---|
| 0 (W) | UNSTABLE | STABLE | STABLE |
| 1000 (W) | UNSTABLE | STABLE | STABLE |
| 2000 (W) | STABLE | STABLE | STABLE |

Comparing Table 3 and Table 4, in comparative example 2 in which the grounding ring 44 was not provided in the exhaust flow path 16, in the case that the supplied electrical power was low, the plasma in the processing space PS underwent hunting and hence the state was unstable. It is thought that this is because the density of the plasma in the processing space PS was low due to the electrical power being low, and hence when leakage of plasma from the processing space PS into the exhaust space ES occurred, the plasma in the processing space PS could not be kept in a stable state. On the other hand, in working example 2 in which the grounding ring 44 was provided in the exhaust flow path 16, regardless of the value of the 40 MHz radio frequency electrical power and the value of the 2 MHz radio frequency electrical power, the plasma was stable. It is thought that this is because there was no leakage of plasma into the exhaust space ES, and hence even when the plasma density in the processing space PS was low, the plasma could be kept in a stable state.

It was thus found that even in the case that a DC voltage is not applied to the upper electrode plate 37, leakage of plasma into the exhaust space ES can be prevented by providing the grounding ring 44 in the exhaust flow path 16.

Next, studies were carried out into the exposed area of the conducting portion 45 of the grounding ring 44 exposed to the exhaust flow path 16.

Specifically, as shown in FIG. 3, a grounding ring 44 for which the insulating film 46 was completely removed (FIG. 3A) (exposed area: 788.8 cm$^2$), a grounding ring 44 for which a width of 1 mm of the insulating film 46 was removed from an upper surface (FIG. 3B) (exposed area: 13.0 cm$^2$), a grounding ring 44 for which a width of 3 mm of the insulating film 46 was removed from the upper surface (FIG. 3C) (exposed area: 39.1 cm$^2$), a grounding ring 44 for which a width of 8 mm of the insulating film 46 was removed from the upper surface (FIG. 3D) (exposed area: 131.2 cm$^2$), a grounding ring 44 for which a width of 8 mm of the insulating film 46 was removed from each of the upper surface and a lower surface (FIG. 3E) (exposed area: 262.4 cm$^2$), and a grounding ring 44 for which the insulating film 46 was removed from part of each of the upper surface, the lower surface, and a side surface (FIG. 3F) (exposed area: 372.4 cm$^2$) were prepared, and the emission intensity of plasma that leaked into the exhaust space ES was then observed when each of the grounding rings 44 was provided in the exhaust flow path 16. Here, a DC voltage of −600V was applied to the upper electrode plate 37 from the DC power source 39, and the combination of the value of the 40 MHz radio frequency electrical power and the value of the 2 MHz radio frequency electrical power supplied to the conductor portion 14 of the susceptor 12 was set to each of 500 W/0 W, 500 W/1000 W, 500 W/2000 W, 1000 W/0 W, and 1000 W/2000 W. The observed emission intensities are shown on a graph in FIG. 4.

Figure 4:
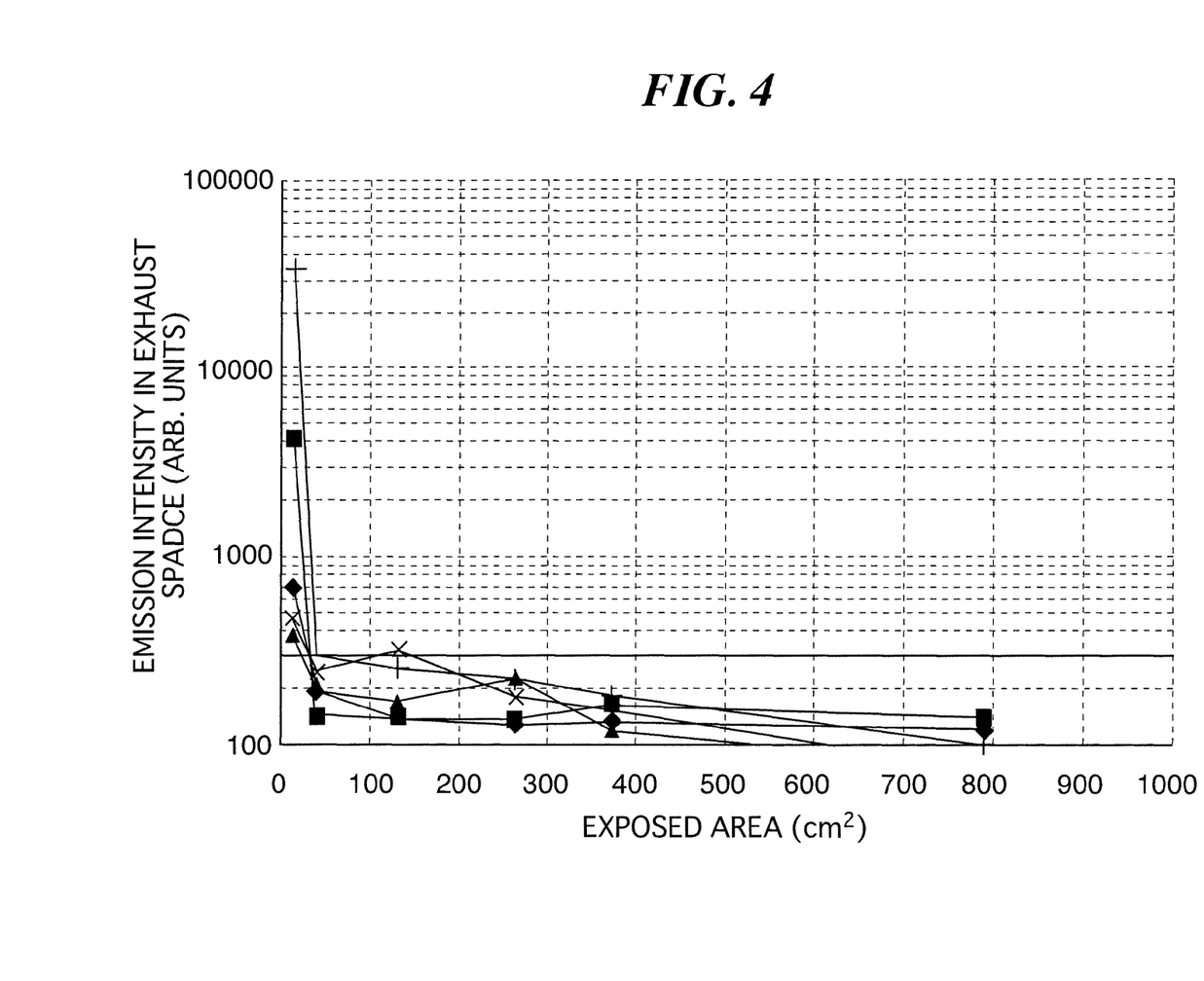
FIG. 4 is a graph showing the emission intensity of plasma in an exhaust space upon changing the exposed area of a conducting portion of a grounding ring.

In the graph shown in FIG. 4, the axis of abscissas shows the exposed area of the conducting portion 45, and the axis of ordinates shows the emission intensity. Moreover, the 500 W/0 W case is shown by "♦", the 500 W/1000 W case is shown by "▲", the 500 W/2000 W case is shown by "×", the 1000 W/0 W case is shown by "■", and the 1000 W/2000 W case is shown by "+".

From the graph shown in FIG. 4, it can be seen that if the exposed area of the conducting portion 45 is not less than 100 cm², then the emission intensity of plasma leaking into the exhaust space ES is below the tolerable emission intensity. That is, it was found that leakage of plasma into the exhaust space ES can be prevented by making the exposed area of the conducting portion 45 exposed to the exhaust flow path 16 be not less than 100 cm². Moreover, the emission intensity hardly changes for all of the values of the exposed area not less than 100 cm², and hence it can be seen that if the exposed area is not less than 100 cm², then sufficient contact area can be secured between the conducting portion 45 and electrons.

Moreover, a grounding ring 44 for which the exposed area of the conducting portion 45 exposed to the exhaust flow path 16 exceeded 1000 cm² was manufactured, and provided in the exhaust flow path 16, whereupon although leakage of plasma into the exhaust space ES was not observed, the plasma ignition performance in the processing space PS greatly decreased. It is thought that this is because the exposed area of the conducting portion 45 was too high, and hence the voltage applied for producing the plasma from the processing gas in the processing space PS escaped via the conducting portion 45, i.e. the voltage in the processing space PS decreased excessively due to the grounding ring 44. It can thus be seen that it is preferable for the exposed area of the conducting portion 45 of the grounding ring 44 exposed to the exhaust flow path 16 to be not more than 1000 cm².

What is claimed is:

1. A plasma processing apparatus having a substrate processing chamber having therein a processing space in which plasma processing is carried out on a substrate, an exhaust space for exhausting gas out of said processing space, and an exhaust flow path that couples said exhaust space and said processing space, the plasma processing apparatus comprising:

an exhaust plate that is a plate-shaped member having a large number of vent holes therein and is disposed in said exhaust flow path; and a grounding component that is attached to said exhaust plate and is electrically grounded, said grounding component being comprised of a member other than said exhaust plate, said grounding component lying downstream of said exhaust plate with respect to said exhaust flow path, wherein said grounding component includes a conducting portion made of a conductive material, said grounding component includes an exposed area, and the exposed area is not covered with an insulating film and exposes the conductive material of the conducting portion to said exhaust flow path, wherein said grounding component is comprised of a ring shaped member and is attached such as to surround an opening of one vent hole in said exhaust plate, and wherein a portion of said grounding component, which faces an exhaust stream flowing out from the opening of the vent hole, corresponds to the exposed area of the grounding component.

* * * * *